United States Patent [19]
Newby et al.

[11] Patent Number: 5,228,061
[45] Date of Patent: Jul. 13, 1993

[54] FAST MAXIMUM LIKELIHOOD DECODER

[75] Inventors: Paul S. Newby; Pasquale Leone, both of Toronto, Canada

[73] Assignee: The Institute for Space and Terrestrial Science, North York, Canada

[21] Appl. No.: 734,617

[22] Filed: Jul. 23, 1991

[30] Foreign Application Priority Data

Jul. 23, 1990 [CA] Canada ................................. 2021744

[51] Int. Cl.$^5$ ........................................... H04L 27/06
[52] U.S. Cl. ........................................ 375/94; 371/43; 341/51
[58] Field of Search ..................... 375/38, 39, 42, 58, 375/67, 94, 99; 371/43, 44, 45; 341/51, 81; 329/304

[56] References Cited

U.S. PATENT DOCUMENTS

| | | | |
|---|---|---|---|
| 4,597,090 | 6/1986 | Forney, Jr. | 375/39 |
| 4,873,701 | 10/1989 | Tretter | 371/43 |
| 5,081,651 | 1/1992 | Kubo | 375/9 X |

Primary Examiner—Stephen Chin
Attorney, Agent, or Firm—Fay, Sharpe, Beall, Fagan, Minnich & McKee

[57] ABSTRACT

A simplified fast maximum likelihood decoder for (1-D) channels comprising a first stage decoder for detecting possible charge violations in a threshold decoded input signal, a second stage decoder for resolving charge violations detected in the first stage decoder by finding the most likely data pattern consistent with the charge constraint of the input signal, and an output shift register for generating corrected estimated decoded data in response to receiving control signals output from the second stage decoder.

6 Claims, 18 Drawing Sheets

FAST MAXIMUM LIKELIHOOD DECODER

FIELD OF THE INVENTION

This invention relates in general to digital signal transmission, and more particularly to a simplified fast maximum likelihood decoder for (1-D) channels.

BRIEF DESCRIPTION OF THE DRAWINGS

The background of the invention and the preferred embodiment will be described in greater detail below with reference to the following drawings, in which.

BACKGROUND OF THE INVENTION

Figure 1:
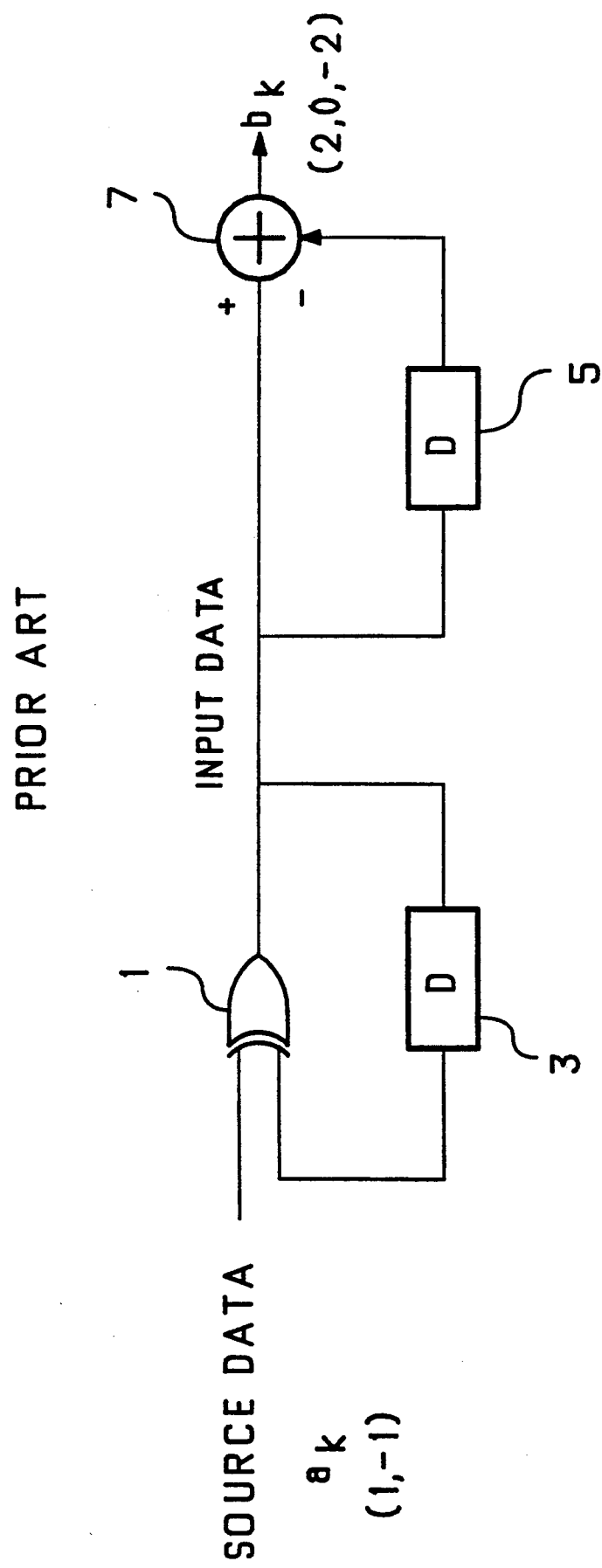
FIG. 1 is a block schematic diagram of a 1-D partial response channel in accordance with well known prior art.

A 1-D partial response channel is shown with reference to FIG. 1. The source data $a(k)=1$ or $-1$, following an operation termed "precoding" implemented by decoder circuitry comprising an EXCLUSIVE-OR gate 1 connected to a unit delay operator 3, passes through a 1-D filter representing an equivalent transmission channel, wherein the filter comprises a unit delay operator 5 connected to a summer 7.

At the output of the 1-D channel, in the absence of noise or distortion, the signal takes on the values $s(k)=2$, 0 or $-2$ depending on the source data $a(k)$. with precoding, $a(k)=abs(s(k))-1$.

In the presence of noise and distortion, a simple threshold decoder can be used to decode the data. More specifically, the data at each clock period is estimated to be $sa(k)=abs(b(k))-1$, where $$b(k) = 2, s(k) > 1$$
$$= -2, s(k) < -1$$
$$= 0, -1 < s(k) < 1$$

It has been discovered that improved decoder performance can be obtained by recognizing that the output of the 1-D filter must be charge constrained. More specifically, the absolute value of the sum of any string of n samples of $b(k)$ ($n=1,2,3,\ldots$) must be less than or equal to 4. Specific solutions have been proposed to optimally decode the data taking this constraint into account, as discussed in Kobayashi, H. "Application of probabilistic decoding to digital magnetic recording", IBM J. Res. Develop., 15, No. 1, pp. 64-71. Probably the simplest version has been proposed by Petersen and Wood their article entitled "Viterbi Decoding of Class IV Partial Response", IEEE Trans. Comm., 34 no. 5, P454, May 1986.

The Viterbi decoder described in the prior art system of Wood and Petersen requires an n-bit adder and decision logic embedded in an add/compare/update loop. There are three inputs to the adder/decision logic: the current signal sample from an analog to digital converter (A/D) at the channel output, a prior sample and a direction indicator. There are therefore $2n+1$ bits of input to the decision logic. The execution speed of the loop will generally be the limiting factor determining the processing speed of the decoder and is degraded as the resolution of the A/D converter increases.

SUMMARY OF THE INVENTION

According to the present invention, further improvements in 1-D decoder design have been obtained by the use of two separate decoding stages. The first stage provides an initial estimate of the data using threshold detection and the second stage modifies the data to enforce the above-identified charge constraint. Since violations of the charge constraint condition can be identified prior to the second stage, variables required by the second stage can be pre-computed to maximize the speed and minimize the complexity of the second stage. More particularly, by minimizing the number of bits required to make decisions in feedback loops in the second stage, maximized decoder performance may be obtained.

Thus, according to the present invention, violations of the charge constraint may be recognized at the output of a first stage threshold decoder by the occurrences of sequences $b(k)=(x,0,0,\ldots 0,0,x)$, where x is 2 or $-2$, and wherein the length of the sequence is greater than or equal to two bits. It will be assumed that only one bit of the sequence is in error and that it may be determined as the bit which was decoded with the least detection margin relative to the threshold between $b(k)$ and $b(k)-x$. The correct value of the bit determined to be in error is thus assumed to be $b_1(k)=b(k)-x$.

In accordance with an aspect of the present invention, there is provided a simplified fast maximum likelihood decoder for (1-D) (where D is the unit delay operator) channels comprising:

a) a first stage for receiving an input analog signal and in response generating a first digital signal representing a threshold detected estimate of the input data corresponding to said threshold detected input signal, a second digital signal representing possible charge violations of said threshold detected input data, and a third digital signal representing a detection margin of said threshold detected estimate, b) a second stage for receiving said first, second and third digital signals and in response generating a fourth digital signal representing a current estimate of the source data corresponding to said input signal based on said threshold detected estimate and current and prior values of said detection margin, and a plurality of control signals representing the location of possible errors in said threshold detected estimate of said input signal based on said possible charge violations and said detection margin, and c) an output shift register for receiving said fourth digital signal and said control signals and selectively inverting a predetermined one or more bits of said current estimate of said input signal responsive to said location of possible errors, thereby generating a corrected decoded output signal.

Figure 2A:
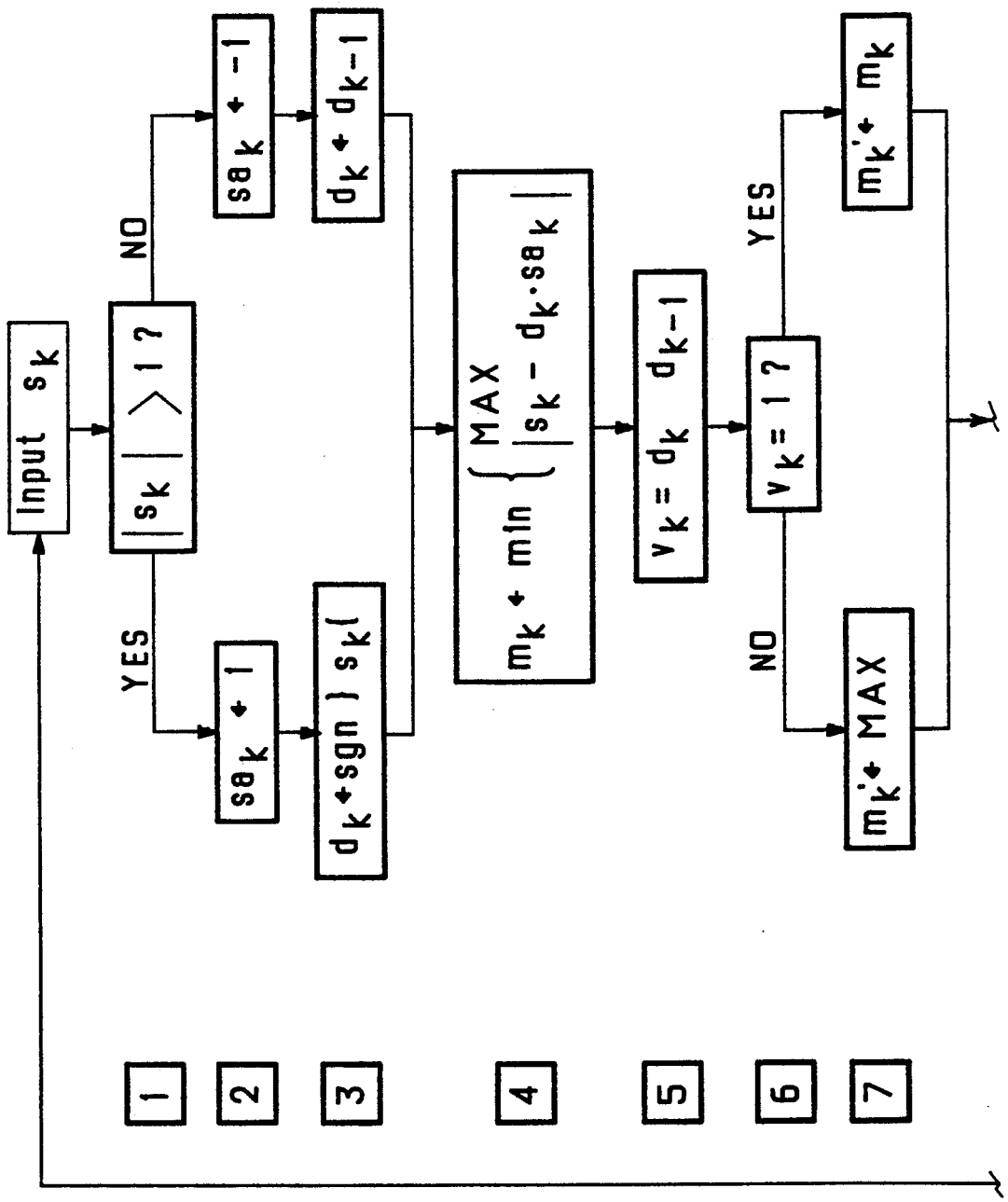
FIGS. 2A-2B are a flow chart for a maximum detection margin algorithm with the preferred embodiment of the present invention.
Figure 2B:
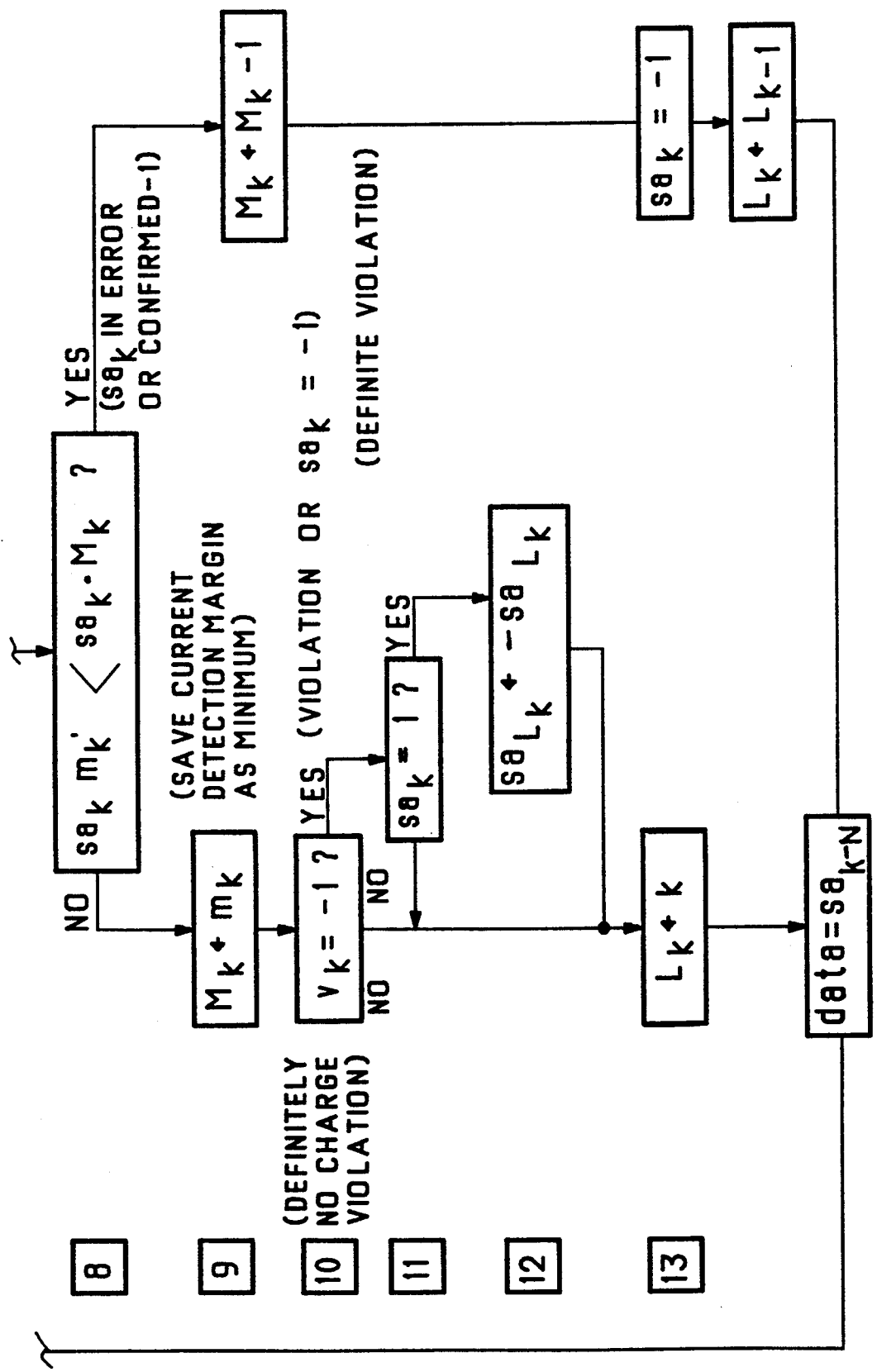

FIGS. 2A-2B show a flowchart of the process required to implement the algorithm of the present invention. Levels 1-7 in the flowchart constitute the first stage of the algorithm of the present invention.

A signal sample s(k) is first decoded by threshold decoding (level 1-2 on the flowchart) and a decoded data bit sa(k) is assigned the appropriate value. At level 3, a direction indicator d(k) is set to the direction of the last decoded transition of the precoded data at the (1-D) channel input. The detection margin m(k) is calculated at level 4, where a maximum can be imposed to reduce the processing requirements of subsequent steps.

At level 5, an indicator flag v(k) is formed as the product of d(k) and d(k−1). If v(k)=−1 and sa(k)=1, a data transition has occurred with no charge violation. In this case, the detection margin m'(k) which is used for comparison in the next stage is set to a maximum. Otherwise, m'(k)=m(k).

Figure 3A:
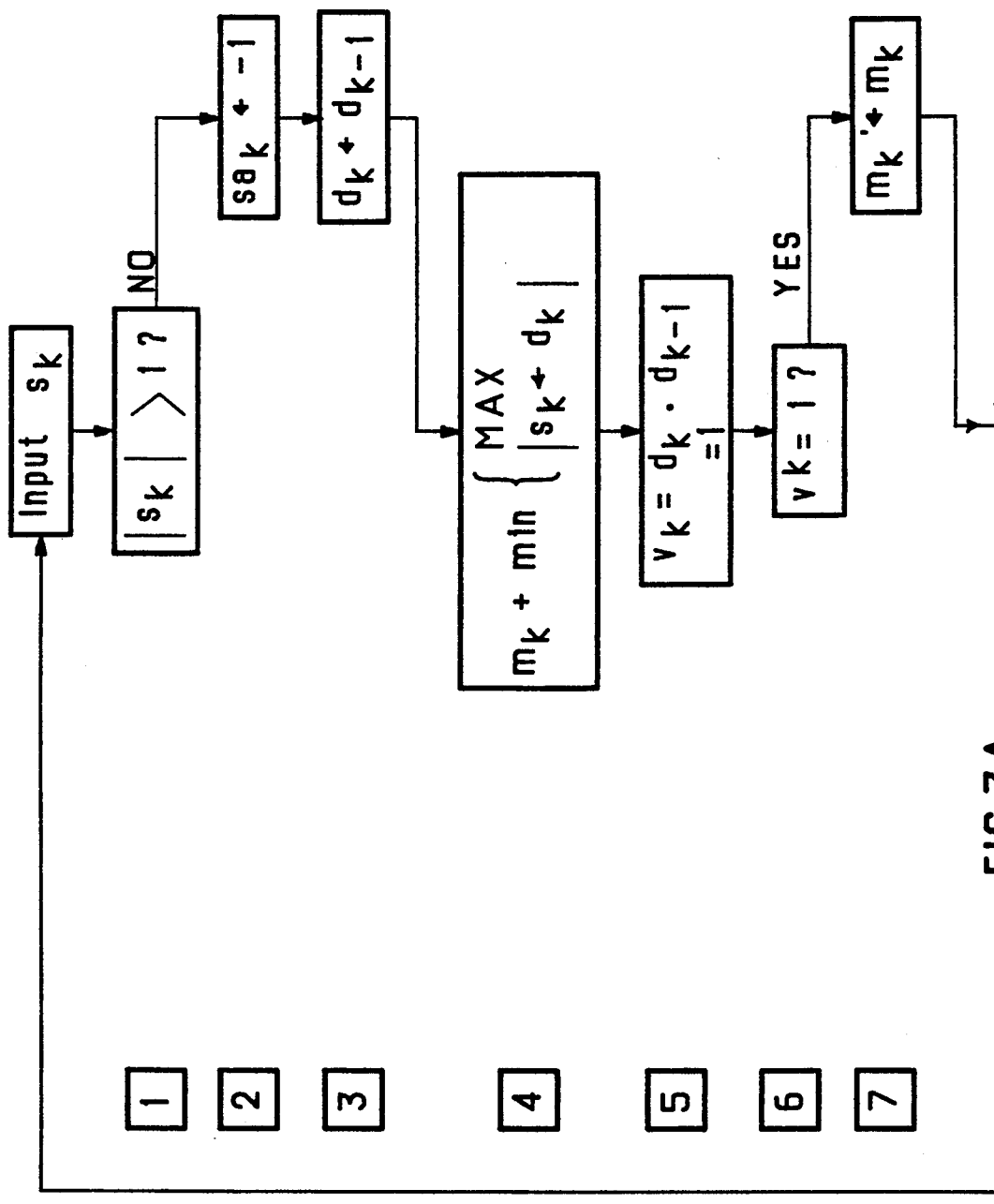
FIGS. 3A-3B are a flow chart of the maximum detection margin algorithm as shown in FIG. 2 with no input data transition decoded.
Figure 3B:
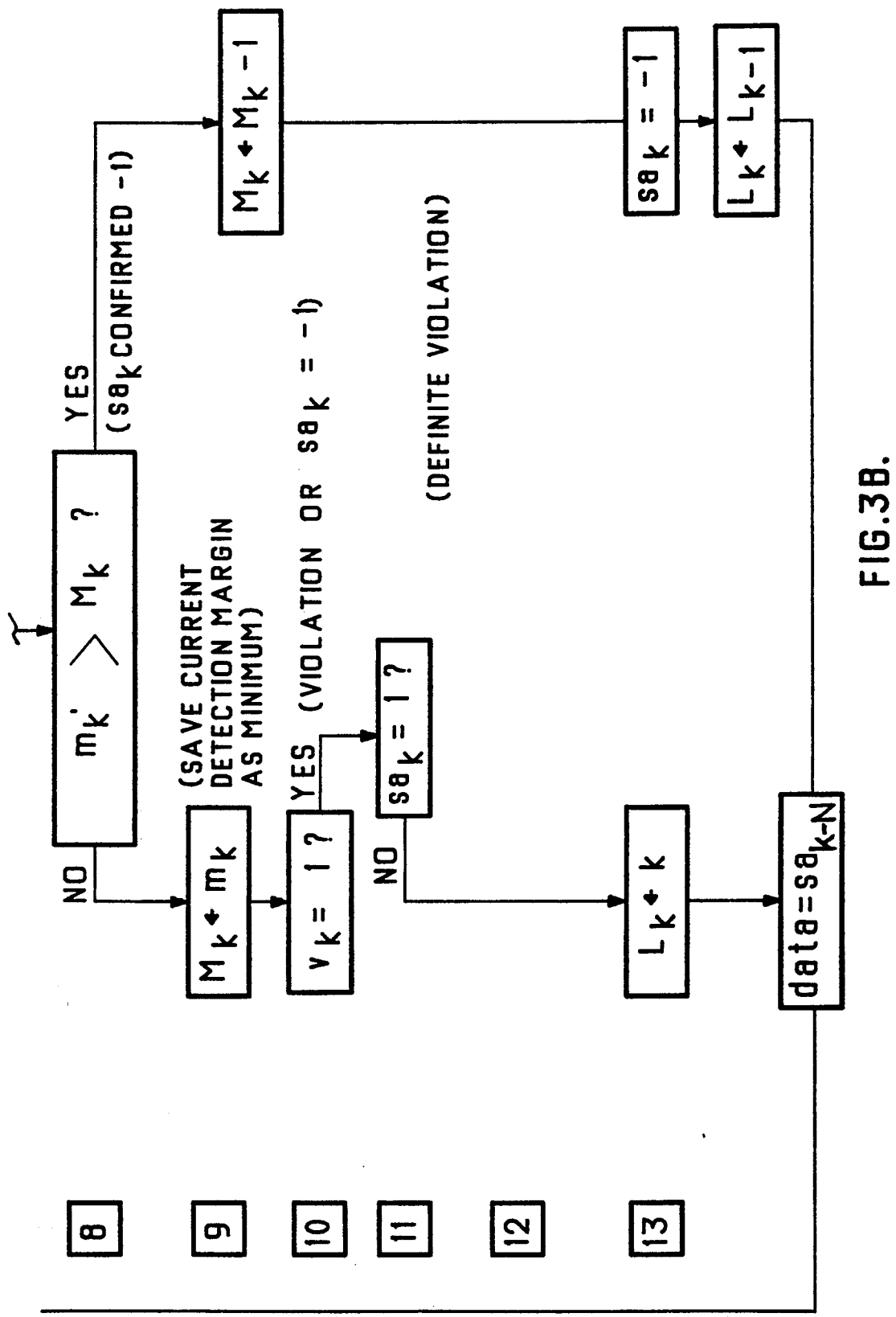
Figure 4A:
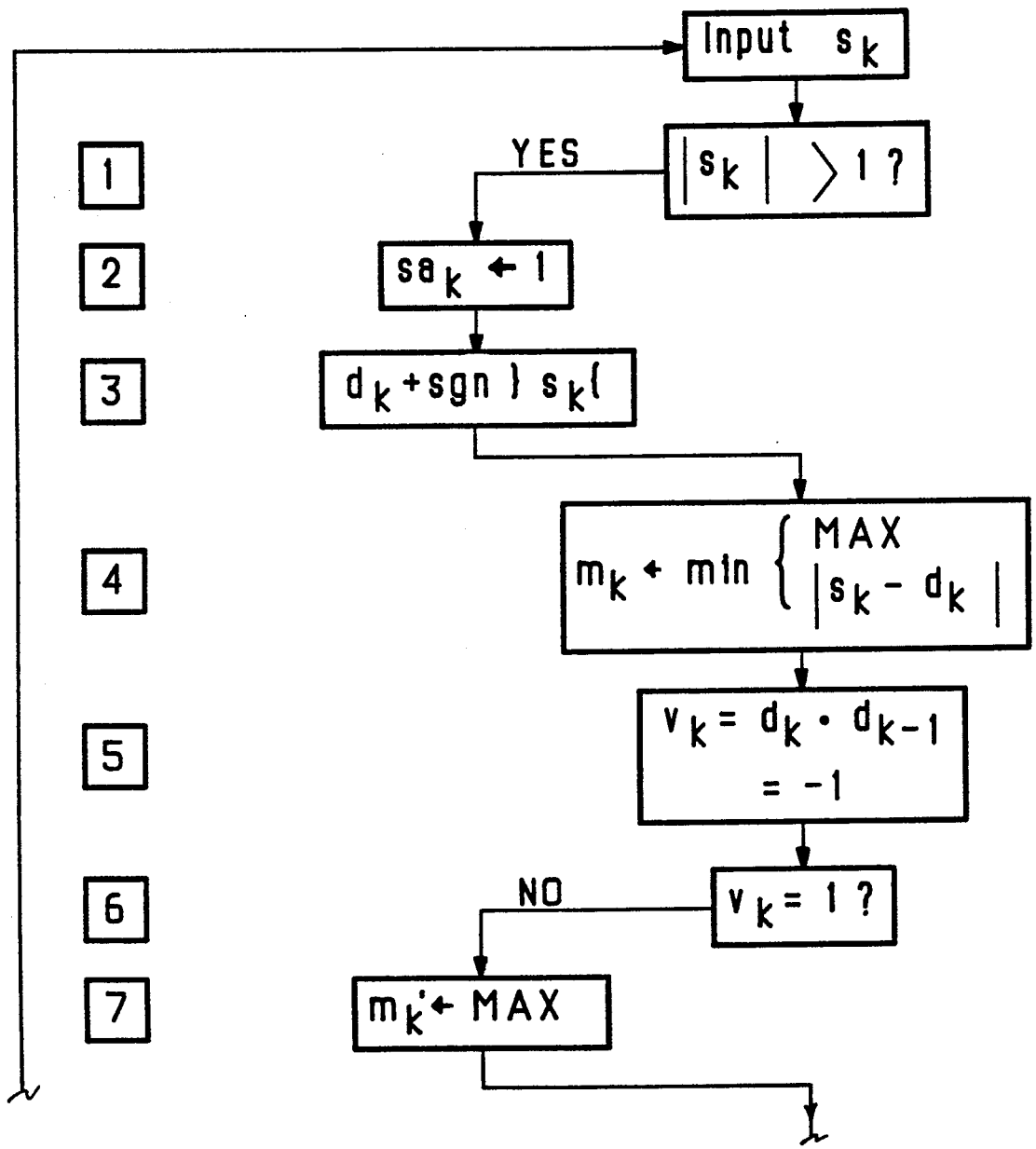
FIGS. 4A-4B are a flow chart of the maximum detection margin algorithm as shown in FIG. 2 with an input data transition decoded and no charge violation detected.
Figure 4B:
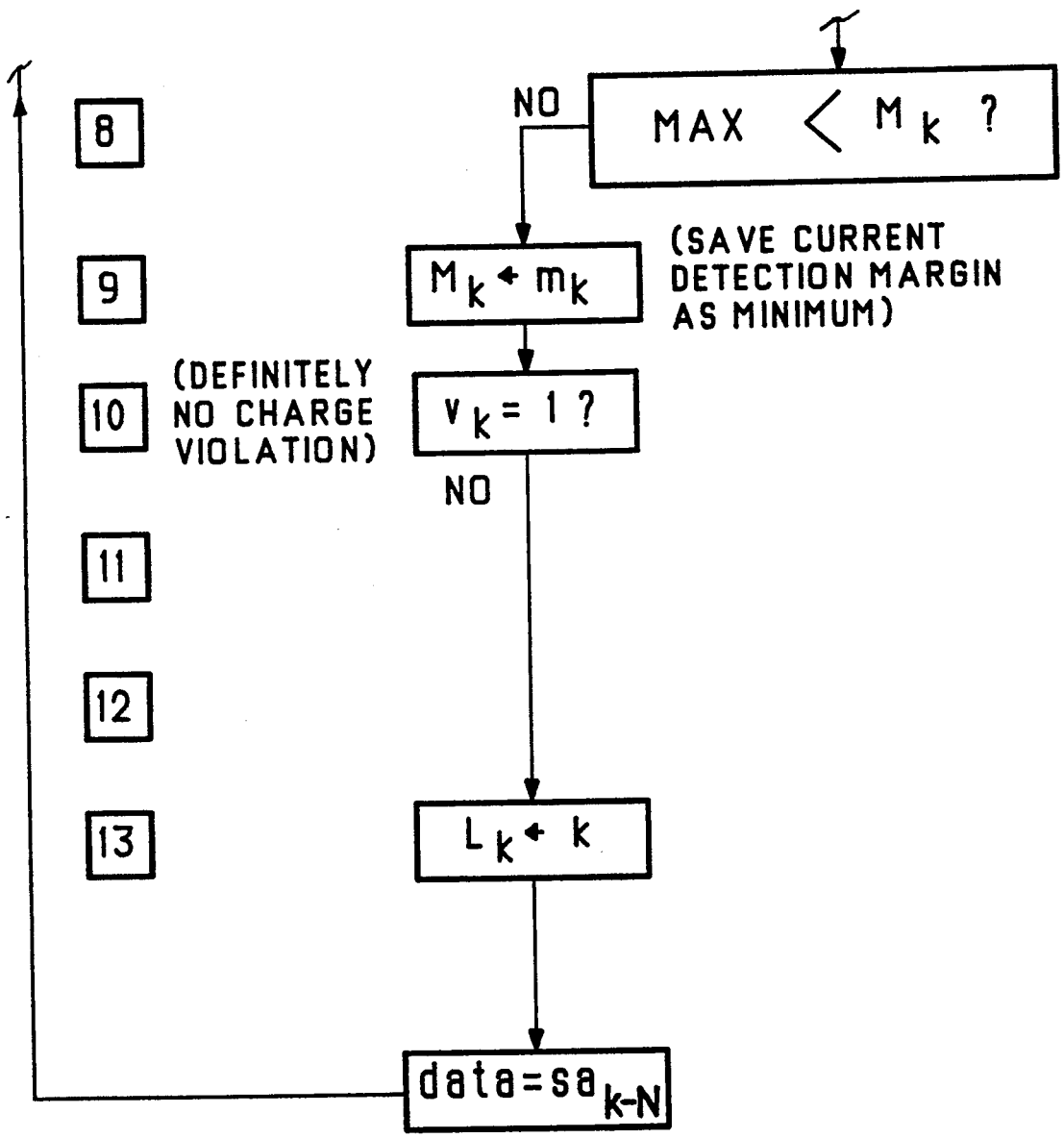

In the second stage (levels 7-11), possible charge violations identified in the first stage are resolved. One of three possible conditions exists upon entry into the second decoding stage, as follows:

1. A violation has not been detected or precluded: sa(k)=−1 and necessarily v(k)=1. In this case, as depicted in FIG. 3, if the detection margin is less than the prior minimum M(k), the margin is saved as the new minimum and the current bit is identified as the most likely error if an error sequence is subsequently detected (left branch, levels 8-11); otherwise the prior minimum is retained (right branch) and no other action is taken.

2. A violation has been definitely ruled out: sa(k)=1 and v(k)=−1. In this case, as depicted in FIGS. 2A-2B show the current bit cannot possibly be the end bit of an error sequence, and no action is to be taken to correct prior bits. The current bit can only be the beginning of the next possible error sequence. Thus, the detection margin used for comparison is set to maximum in order to force the algorithm to branch left at level 8. The current detection margin is saved as the minimum, M(k), and the current bit is identified as the most likely error if an error sequence is detected.

Figure 5A:
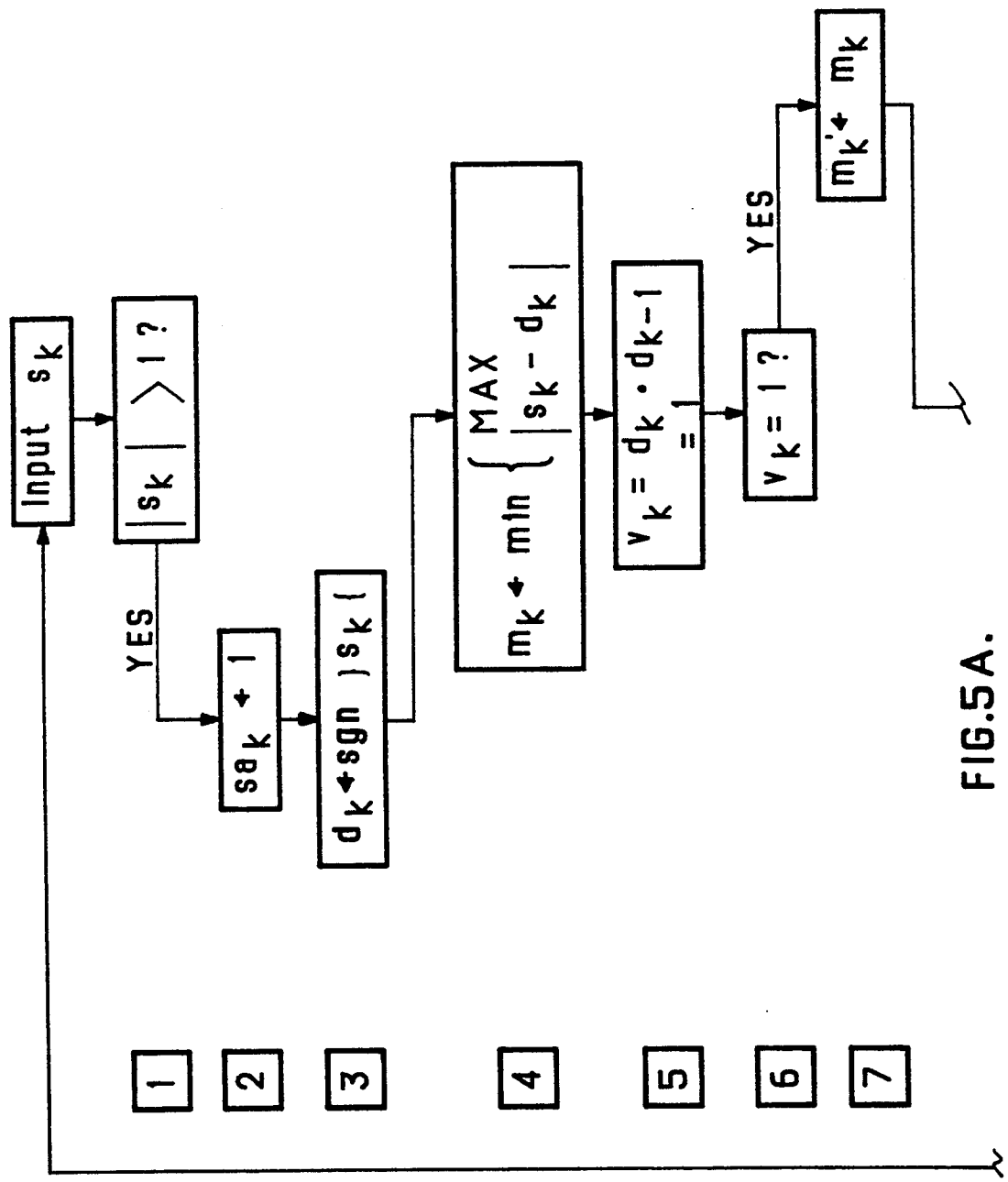
FIGS. 5A-5B are flow chart of the maximum detection margin algorithm of the present invention with a data transition decoded and a charge violation detected.
Figure 5B:
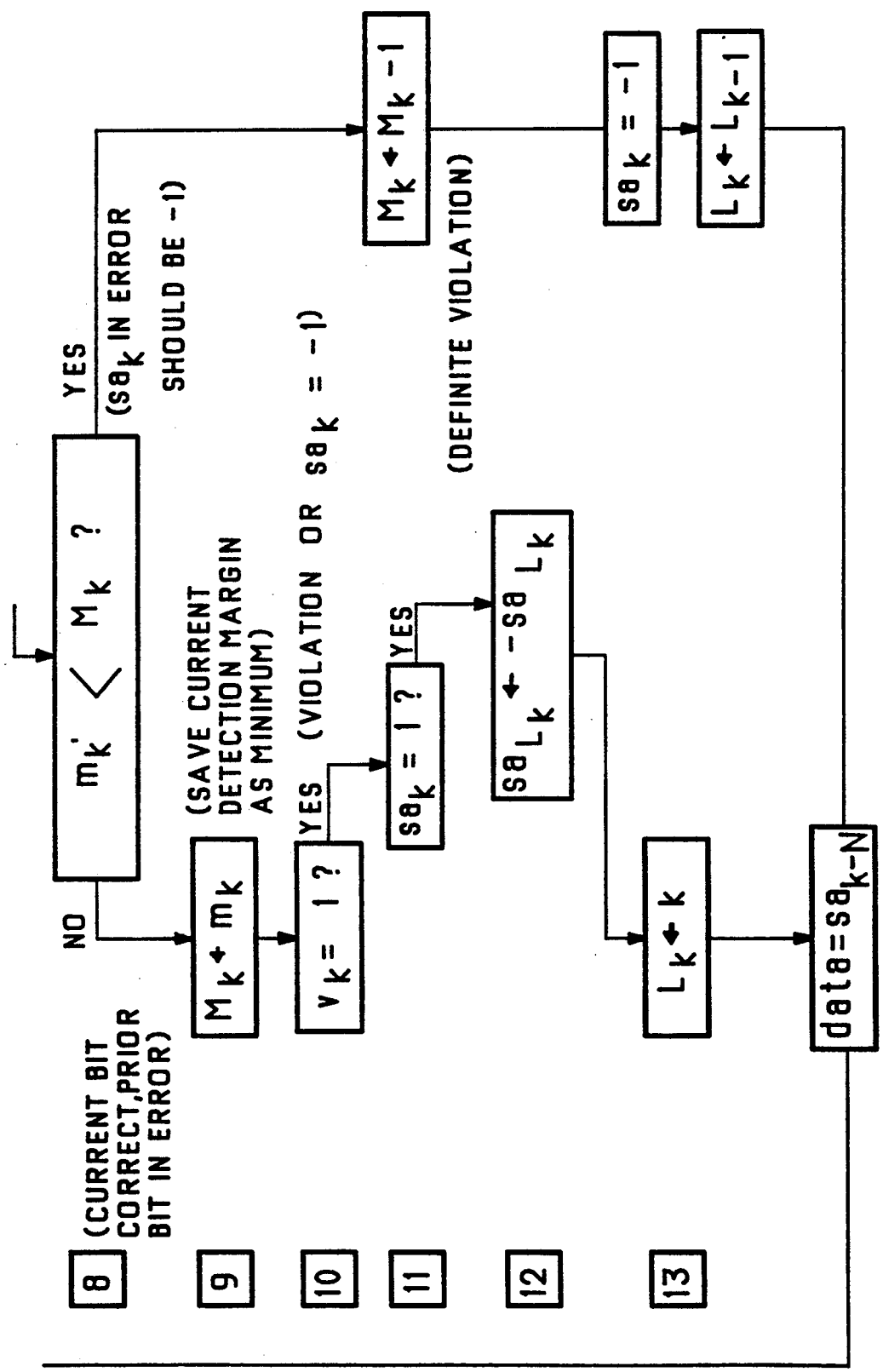

3. A violation has been detected: sa(k)=v(k)=1. In this case, as depicted in FIGS. 5A-5B, the current bit has been identified as the end of an error sequence. If this bit was decoded with minimum margin, it is assumed to be in error, and the prior minimum margin is saved (right branch, level 8). If the bit does not have the minimum margin, a prior bit already determined to have been decoded with the minimum margin is assumed to be in error (left branch, level 8). In this case, the current bit is the beginning of the next possible error sequence, and the current margin is retained as the minimum.

In the last stage of the algorithm (levels 12-13 FIGS. 2A-5B), the history of past decisions is retained and corrections to bits determined to be in error are performed. Whenever the current detection margin is saved as the minimum, the position of the current bit is saved in a register L(k) (level 13). If a violation has been detected in a prior bit, the bit identified by L(k) is inverted (level 12). Otherwise, the prior position is retained. The correct decoded data is then output at time K+N, where N is an integer representing the decoder delay.

FIGS. 6A-8B illustrate a binary logic implementation of the algorithm of the present invention in accordance with the preferred embodiment. The binary logic states are assumed to be 1 and −1. In the first stage decoder of FIGS. 6A-6B, an output analog signal is converted by an n-bit A/D converter 9 to yield an input signal sample s(k). The A/D signal output (s(k)) is threshold decoded via decoder 11 to determine an estimate of the source data, sa(k). The polarity of the most recent nonzero bit (d(k)) is latched in a first register 13.

First register 13 generates at the Q output thereof the aforementioned direction indicator signal d(k). This signal is applied to a data input of a second register 17 having a clock input connected for receiving clock signal C1 derived from the input data signal.

The Q output of the second register 17 is connected to a first input of an exclusive NOR gate 19, a second input thereof being connected to the Q output of register 13 for receiving the direction indicator signal d(k). Gate 19 generates the above-identified indicator flag v(k) which is then inverted via an invertor 21 and applied to a first input of a set of j OR gates 23. The second inputs of the OR gates 23 are connected to outputs of margin calculator 15 for receiving j bits of the detection margin signal m(k) output therefrom. In response to receiving the m(k) and d(k), gates 23 generates a comparison margin signal m'(k).

A charge violation is detected under the following condition:

$$\text{VIOLATION} = sa(k) \text{ AND } v(k)$$

where $$v(k) = (d(k) \text{ EXNOR } d(k-1)).$$

When VIOLATION=1, the end bit of an error sequence has been detected. The detection margin m(k) of the threshold detected estimated data sa(k) is determined by means of a margin calculator according to the relation:

$$m(k) = \min[abs\{s(k) - d(k)sa(k)\}, \text{MAX}]$$

It should be noted that the detection of margin m(k) is restricted to the interval {0, MAX}, and as a result fewer than n bits are required to represent m(k). More particularly, the number of bits required is $$j = n - \log 2(4/\text{MAX}).$$

The implementation of the preferred embodiment shown in FIG. 6 assumes a limit of the absolute value of the noise and distortion of (1+MAX). For practical ranges of SNR, a limit of MAX=1 provides a significant improvement in processing requirements in the second stage (FIG. 7) with negligible loss in performance. In this case, j=n−2.

For further simplification of subsequent processing, m(k) is modified via OR gate 23 as follows:

$$m'(k) = \text{MAX}, v(k) = -1 \text{ (data transition decoded, no charge violation)}$$
$$= m'(k) \text{ otherwise}$$

Figure 6A:
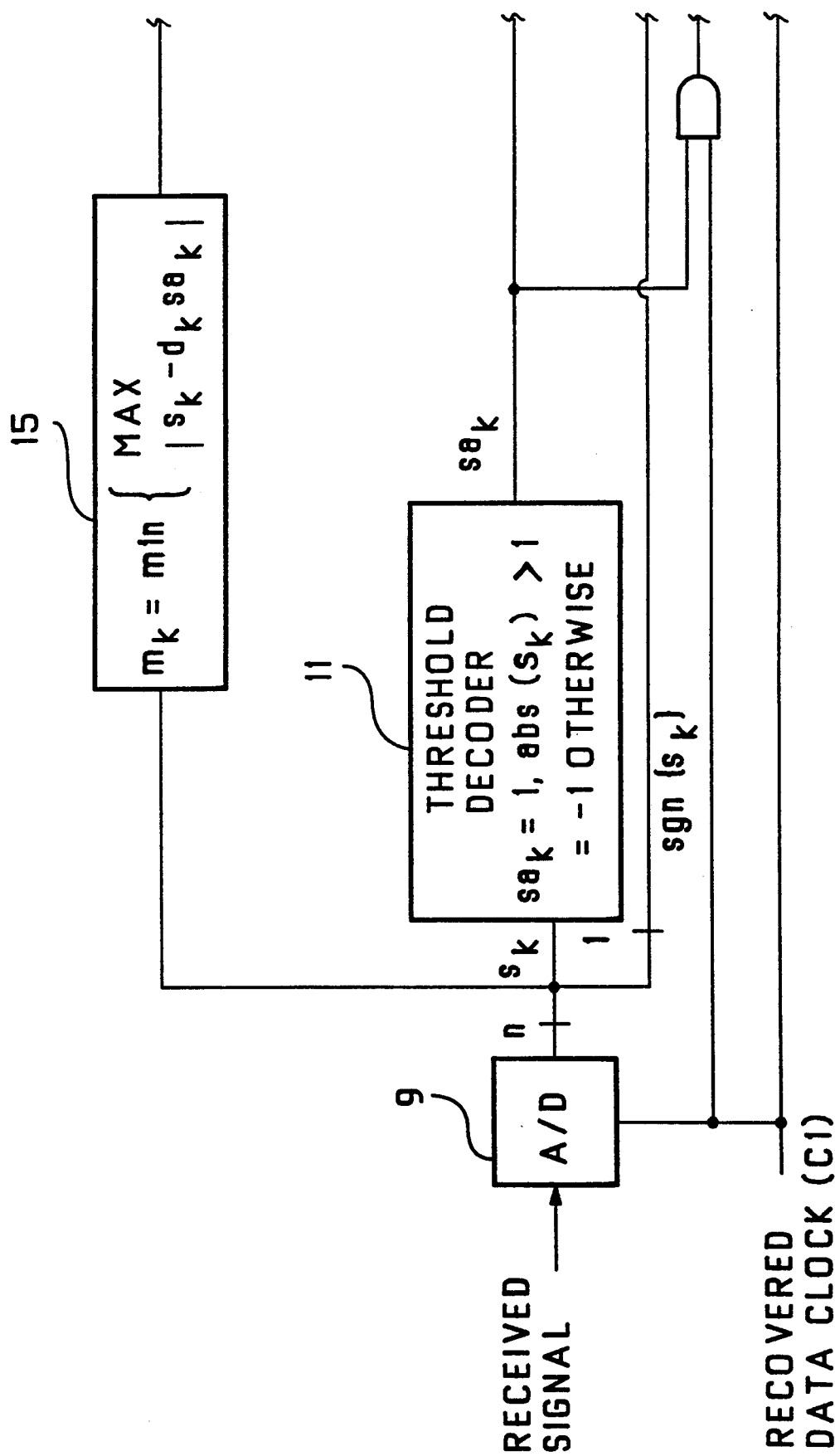
FIGS. 6A-6B are a block schematic diagram of a first stage decoder in accordance with the preferred embodiment.
Figure 6B:
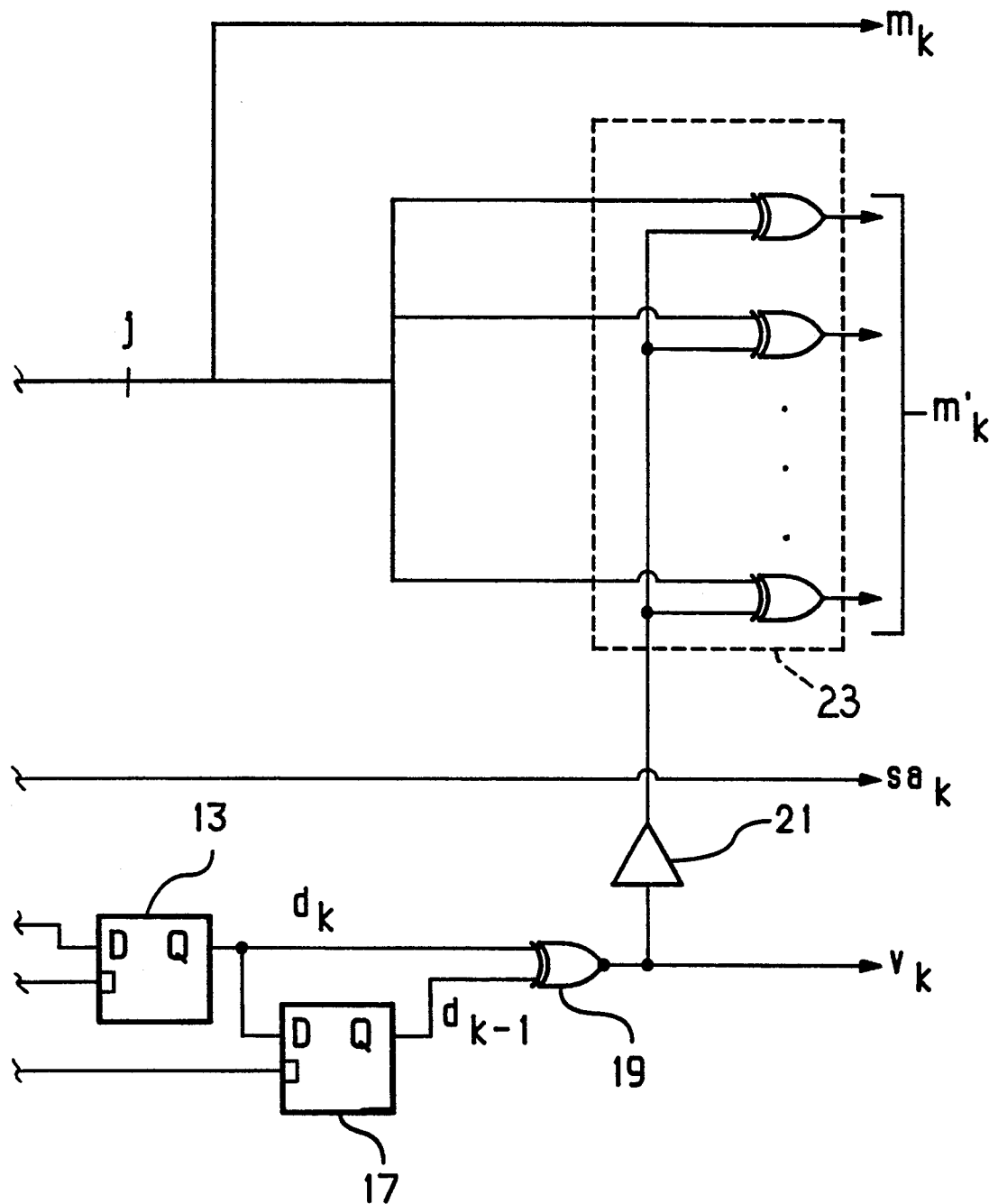
Figure 7:
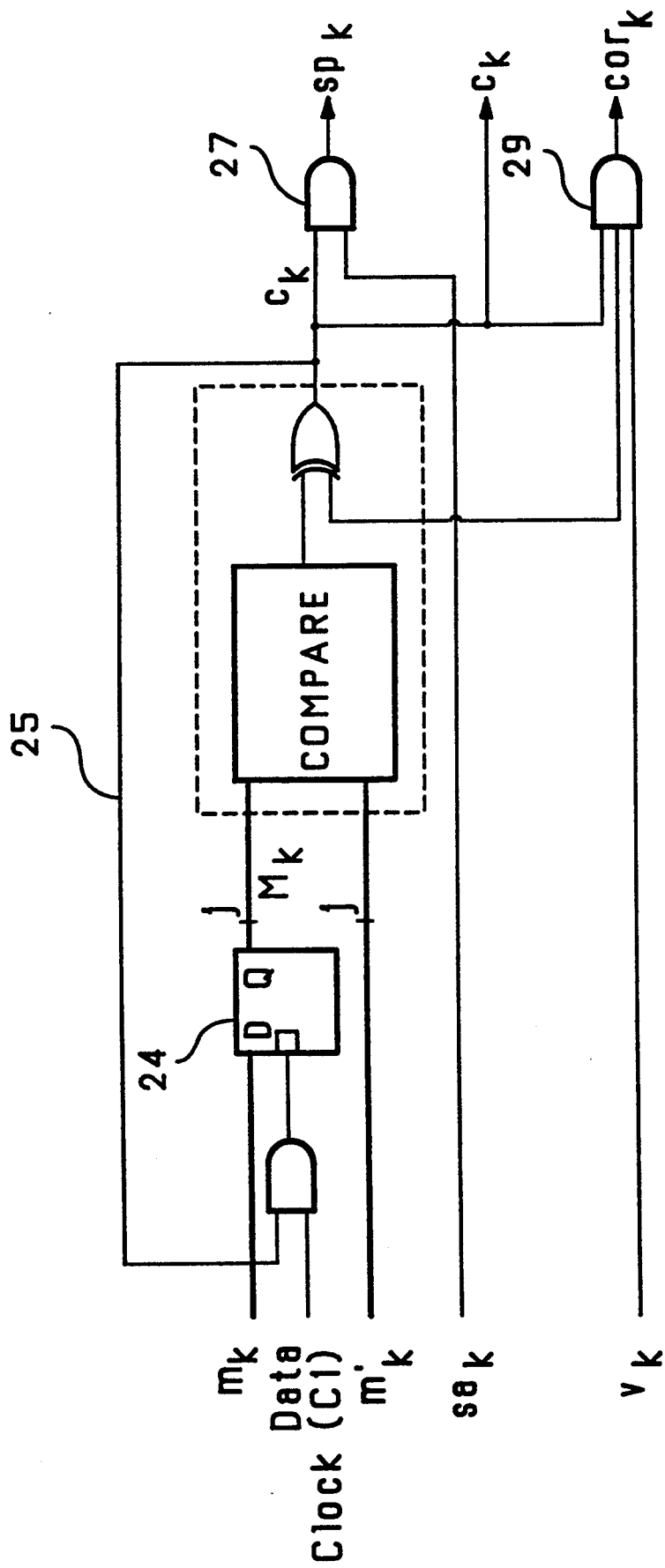
FIG. 7 is a block schematic diagram of a second stage decoder in accordance with the preferred embodiment.

Turning to FIG. 7, the second decoder stage is shown in which charge violations detected in the first stage are resolved by finding the "most likely" data pattern consistent with the charge constraint. The detection margin signal m(k) is clocked into a third register 24 (conditional on the output of the compare cell 25) which in response generates a j bit prior minimum signal M(K) for application to a compare/save cell 25. A compare/save loop is also described in the prior art system of Wood and Petersen. However, according to the present invention, the inputs are the current modified detection margin m'(k), the prior saved margin M(k) and the threshold decoded data sa(k). Assuming j=n−2, there are 2(n−2)+1=2n−3 bits of input to the cell 25, an improvement of four bits being obtained as a result of preprocessing of the loop variables in the first stage decoder (FIGS. 6A–6B). This translates into higher execution speeds and less hardware.

The modified detection margin m'(k) for the current bit is compared with the prior minimum M(k) by means of compare/save cell 25, and EXCLUSIVE-OR'd with the estimate signal sa(k) for generating a compare output signal c(k), conforming to the following condition:

$$c(k) = 1 \text{ EXOR } sa(k), \quad m'(k) < M(k)$$
$$= -1 \text{ EXOR } sa(k), \quad m'(k) >= M(k)$$

the minimum margin register 24 is updated as:

$$M(k+1)=m(k), c(k)=1$$

$$M(k+1)=M(k), c(k)=-1$$

The compare output signal c(k) is applied to a first input of an AND gate 27, the second input thereof being provided for receiving the estimated signal sa(k). The c(k) and sa(k) signals are also applied to the first pair of inputs of a further AND gate 29, the third input thereof being provided for receiving the indicator flag v(k).

The outputs of the second stage decoder are:
1. The current estimated data sp(k). Unless the current bit has been identified as an error (c(k) NOT AND sa(k)=1, in which case sp(k)=−1), sp(k)=sa(k). sp(k)=sa(k) AND c(k). That is,
2. A possible error flag=1 if the current bit has minimum detection margin. The signal is identical to c(k).
3. A correct signal cor(k)=1 if a violation has been detected and sa(k) has been confirmed to be 1; i.e., cor(k)=sa(k) AND v(k) AND c(k). This signal indicates a prior bit has been determined to be in error.
4. A clear signal=c(k). This signal indicates that the current has been labeled as a possible unresolved error and any prior unresolved error is to be cleared.

Figure 8A:
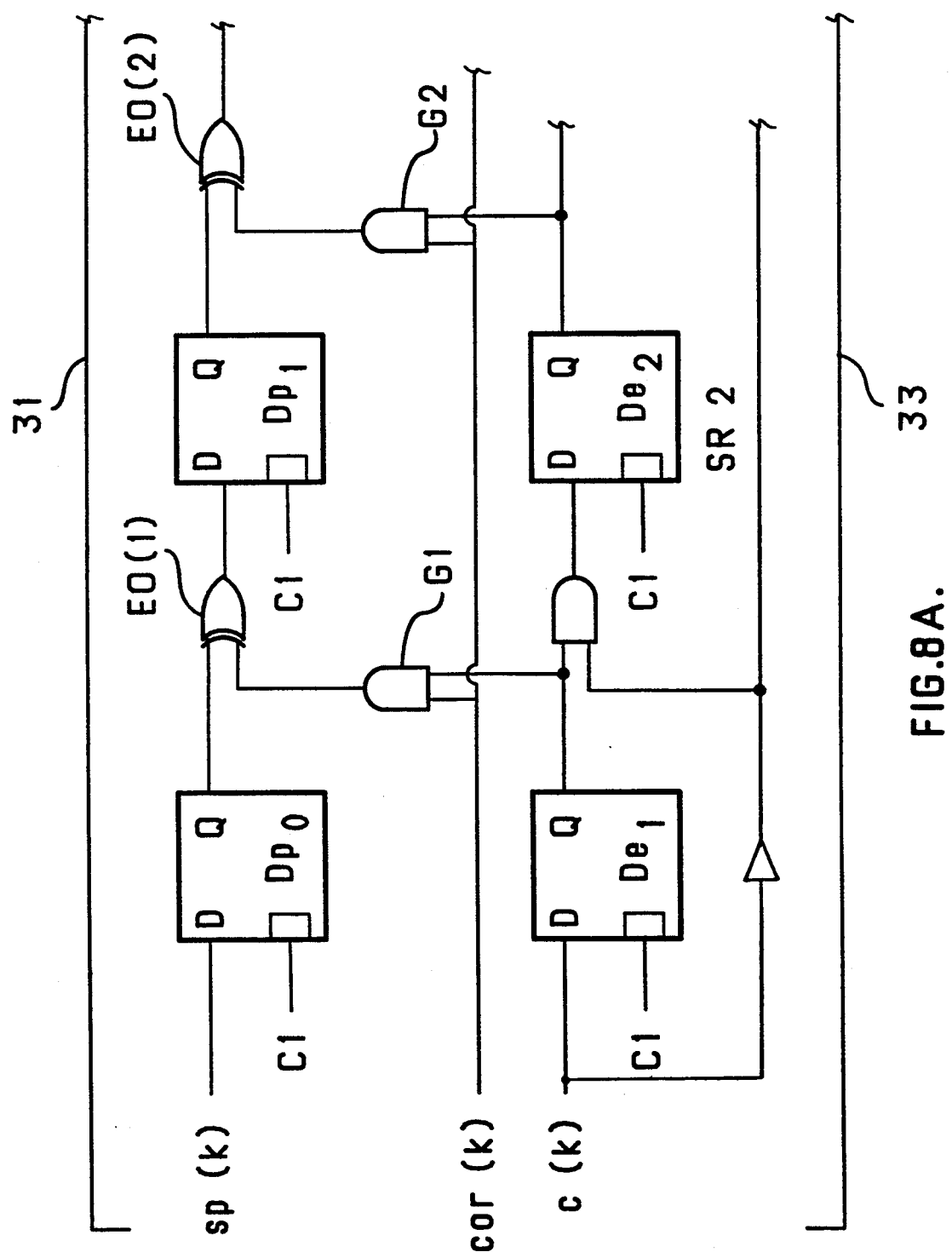
FIGS. 8A-8B are a block schematic diagram of an output shift register in accordance with the present invention.
Figure 8B:
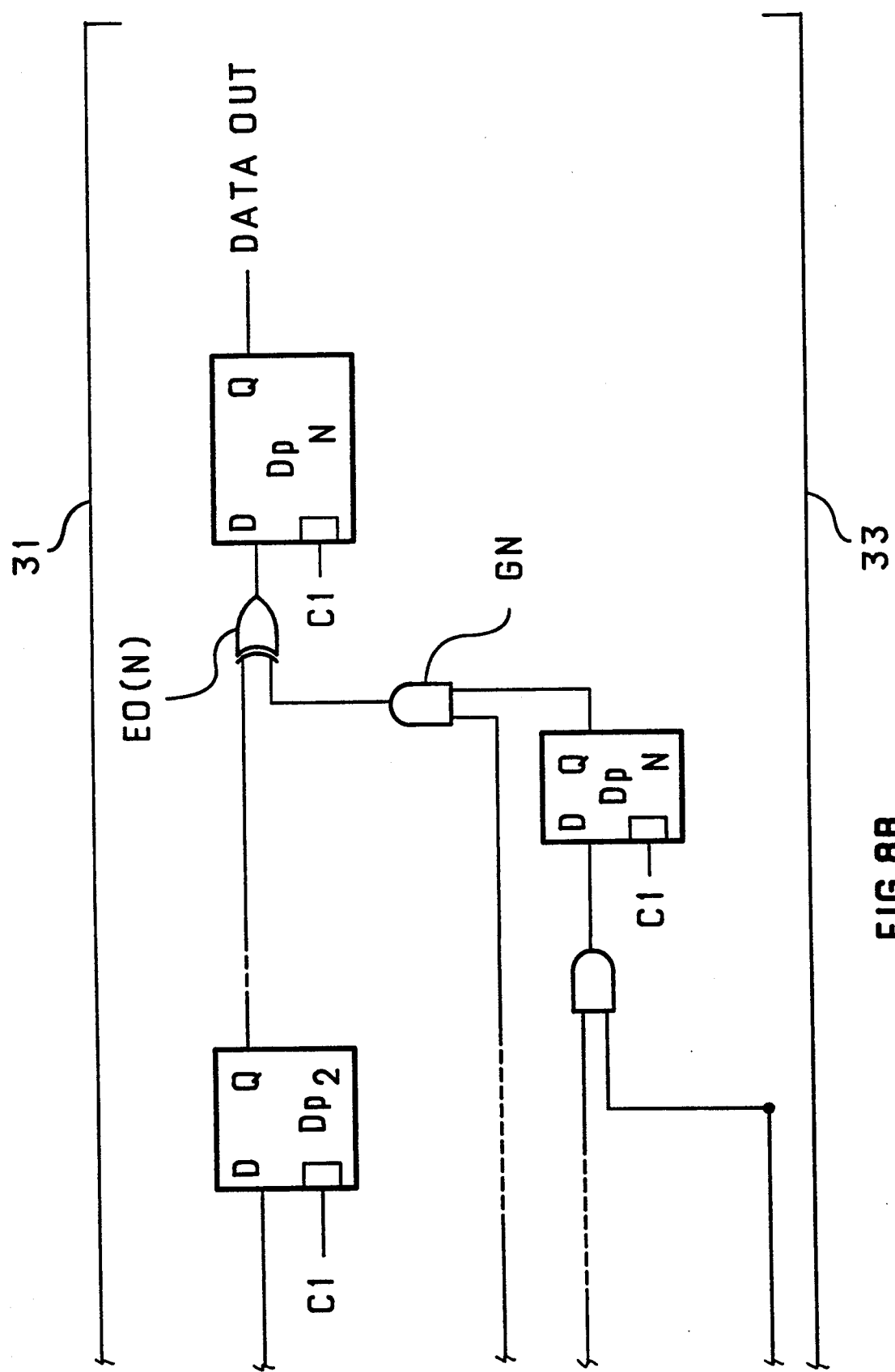

Turning to FIGS. 8A–8B, an output shift register is shown comprising a data register 31 and a possible error register 33. The data register 31 comprises a plurality of series connected shift register cells each including a two input AND gate (G1,G2 . . . GN) having an output connected to an EXCLUSIVE OR gate (EO(1), EO(2) . . . EO(N)) which in turn has an output connected to a data input of a one bit register ($D_{p1}, D_{p2} \ldots D_{pN}$).

A first input of EXCLUSIVE OR gate EO1 is connected to the output of AND gate 27 in the second stage decoder shown in FIG. 7. The first inputs of successive ones of the exclusive OR gates EO(2) . . . EO(N) are connected to respective outputs of adjacent registers $D_{p1} \ldots D_{p(N-1)}$. The derived data clock signal c1 is applied to a clock input of respective ones of the registers $D_{p1} \ldots D_{pN}$.

The correct signal cor(k) is applied to the input of register $D_{po}$ and to one input of successive ones of AND gates G1, G2 . . . GN, while the other input of the AND gates are connected to respective outputs of possible error register 33.

The error register 33 comprises a plurality of series connected register cells each including a one-bit register ($D_{e1}, D_{e2} \ldots D_{eN}$) having an output connected to a first input of an additional AND gate (G,(1) . . . G,(N)). The possible error flag signal se(k) is applied to a data input of register Del while data inputs of successive ones of the registers $D_{e2} \ldots D_{eN}$ are connected to the outputs of adjacent AND gates G'1 . . . G'N.

The clear signal c(k) is received from compare/save cell 25 (FIG. 7) and applied to an invertor 35, the output of which is connected to respective second inputs of AND gates G'(1) . . . G'(N).

In operation, the outputs of the second stage decoder are used to control the N-bit data register 31 and error register 33. The input of the data register 31 is the estimated data sp(k). The input of the error register 33 is the error flag c(k). When the correct signal cor(k) is high, the data bit identified by the nonzero element of error register 33 is inverted. A logical high on the clear signal c(k)clears all but register $D_{e1}$ of error register 33. It should be noted that only one of the registers $D_{e1}, D_{e2} \ldots D_{eN}$ can be nonzero at any time. The corrected estimated data is obtained at the output of data register 31.

Since N is finite, it is possible the error flag will arrive at the end of error register 33 (i.e. $D_{eN}$) before a violation is identified; however, in random data the probability of such an event is approximately pv/(2**N), where pv is the probability of the detection of a violation. Since error register 33 contains the best current estimate of data at time K−N, the percentage of errors attributable to shift register overflow is small for relatively short shift registers.

The shift register implementation shown in FIGS. 8A–8B requires two global information signals: c(k) and cor(k). The time required for these signals to propagate to each cell in data register 31 and register 33 can limit the processing speed of the circuit.

Figure 9A:
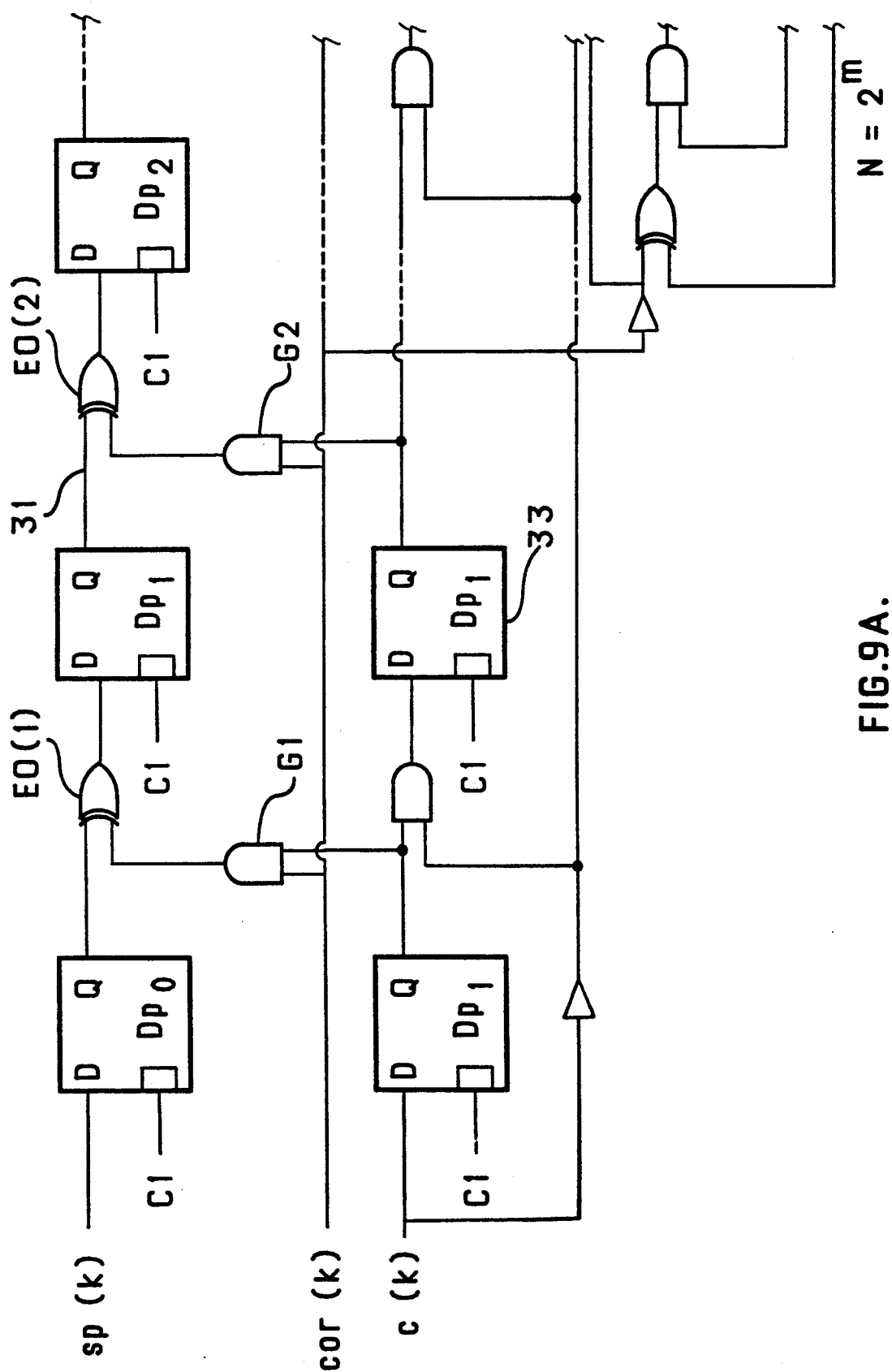
FIGS. 9A-9B are a block diagram of an output shift register in accordance with an alternative embodiment of the present invention.
Figure 9B:
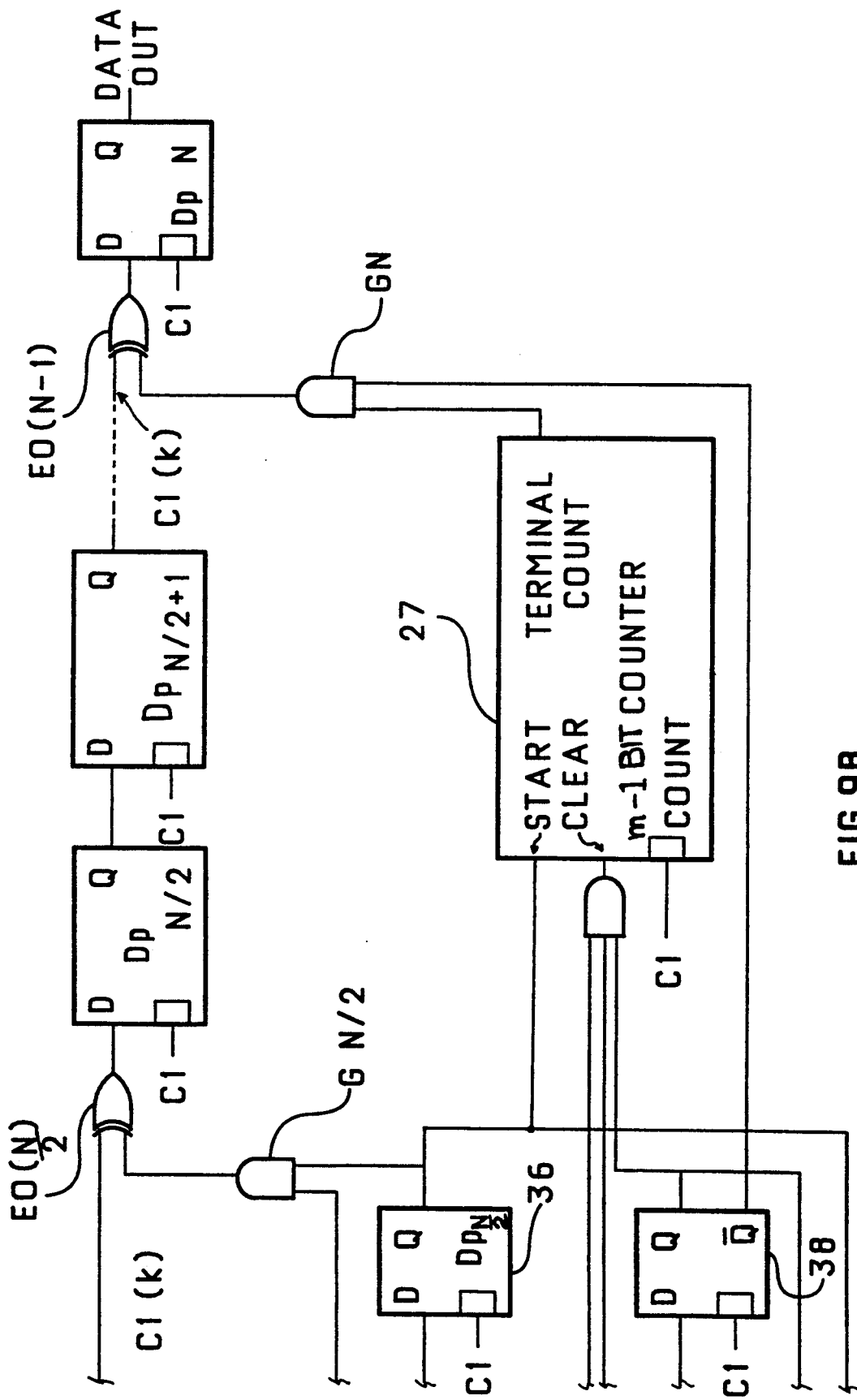

The implementation shown in FIGS. 9A–9B can be used to increase the speed of the shift register by reducing the number of shift register elements serviced by the global signals by a factor of two. The first half of the circuit is the same as in FIGS. 8A–8B. In the second half of the circuit, a counter 37 is used in place of error register 33 shown in FIGS. 8A–8B. This is possible as a result of the fact that only one bit of the error register can be non zero at any given time. This means that only one correction can be made in the last N/2 clock periods before the data exits register 31. The counter 37 is used to tag the position of the possible error, as detected by the first stage decoder of FIGS. 6A–6B.

The non-zero output from the last cell 36 in register 33 clears the counter 37, enabling a countdown via the counter START input, and sets a further register 38 (CLEAR ENABLE (CE)) enabling the counter 37 CLEAR input. If c(k) goes to a logic high level before the counter 37 reaches a terminal count value, indicating a new possible error, the counter 37 is cleared. If cor(k) is pulsed before c(k) goes to a logic high level, a correction is indicated; the CLEAR ENABLE signal is reset to a logic low level and the counter 37 counts unconditionally to the predetermined terminal count value, at which time the tagged bit has proceeded to the output of register 31 and is corrected. If the CLEAR ENABLE signal is still set to a logic high level when the terminal count value is attained by counter 37, the tagged bit is not corrected.

The operation of counter 37 is shown in greater detail with reference to Table 1.

TABLE 1

M-1 BIT COUNTER OPERATION

| TIME k | START s(k) | CLEAR cir(k) | COUNTER STATE C(i, k) 1 2 3 ... M − 1 | TERMINAL COUNT tc(k) |
|---|---|---|---|---|
| 1 | 0 | x | 0 0 ... 0 0 | 0 |
| 2 | 1 | 0 | 0 0 ... 0 0 | 0 |
| 3 | 0 | 0 | 0 0 ... 0 1 | 0 |
| 4 | 0 | 0 | 0 0 ... 1 0 | 0 |
| 5 | 0 | 0 | 0 0 ... 1 1 | 0 |
| 6 | 0 | 0 | 0 0 ... 0 0 | 0 |
| 7 | 0 | 0 | 0 0 ... 0 1 | 0 |
| . | | | | |
| M | 0 | x | 1 1 ... 1 1 | 1 |
| M + 1 | 0 | x | 0 0 ... 0 0 | 0 |
| M + 2 | 0 | x | 0 0 ... 0 0 | 0 |

CLEAR INPUT:
Low input enables count
High input disables count, resets counter state to all zeros at next clock cycle IMPROVED OUTPUT SHIFT REGISTER
Example Control Sequences EXAMPLE 1: no correction, counter not cleared

| k | c(k) | cor(k) | ce(k) | Register 33 SR2 (i, k) 1 2 3 4 | C(i, k) 1 2 | tc(k) | ci(k) | |
|---|---|---|---|---|---|---|---|---|
| 1 | 1 | 0 | x | x x x x | x x | 0 | 0 | |
| 2 | 0 | 0 | x | 1 0 0 0 | 0 0 | 0 | 0 | |
| 3 | 0 | 0 | x | 0 1 0 0 | 0 0 | 0 | 0 | |
| 4 | 0 | 0 | x | 0 0 1 0 | 0 0 | 0 | 0 | |
| 5 | 0 | 0 | x | 0 0 0 1 | 0 0 | 0 | 0 | |
| 6 | 0 | 0 | 1 | 0 0 0 0 | 0 0 | 0 | 0 | ;counter enable |
| 7 | 0 | 0 | 1 | 0 0 0 0 | 0 1 | 0 | 0 | |
| 8 | 0 | 0 | 1 | 0 0 0 0 | 1 0 | 0 | 0 | |
| 9 | 0 | 0 | 1 | 0 0 0 0 | 1 1 | 1 | 0 | ;terminal count with |
| 10 | 0 | 0 | 1 | 0 0 0 0 | 0 0 | 0 | 0 | ;no correction |
| 11 | 0 | 0 | 1 | 0 0 0 0 | 0 0 | 0 | 0 | |

EXAMPLE 2: no correction, counter cleared

| k | c(k) | cor(k) | ce(k) | Register 33 SR2 (i, k) 1 2 3 4 | C(i, k) 1 2 | tc(k) | ci(k) | |
|---|---|---|---|---|---|---|---|---|
| 1 | 1 | 0 | x | x x x x | x x | 0 | 0 | |
| 2 | 0 | 0 | x | 1 0 0 0 | 0 0 | 0 | 0 | |
| 3 | 0 | 0 | x | 0 1 0 0 | 0 0 | 0 | 0 | |
| 4 | 0 | 0 | x | 0 0 1 0 | 0 0 | 0 | 0 | |
| 5 | 0 | 0 | x | 0 0 0 1 | 0 0 | 0 | 0 | |
| 6 | 0 | 0 | 1 | 0 0 0 0 | 0 0 | 0 | 0 | ;counter enable |
| 7 | 0 | 0 | 1 | 0 0 0 0 | 0 1 | 0 | 0 | |
| 8 | 1 | 0 | 1 | 0 0 0 0 | 0 0 | 0 | 0 | ;counter cleared, |
| 9 | 0 | 0 | 1 | 1 0 0 0 | 0 0 | 0 | 0 | ;no correction |
| 10 | 0 | 0 | 1 | 0 1 0 0 | 0 0 | 0 | 0 | |
| 11 | 0 | 0 | 1 | 0 0 1 0 | 0 0 | 0 | 0 | |

EXAMPLE 3: correction via counter terminal count

| k | c(k) | cor(k) | ce(k) | Register 33 SR2 (i, k) 1 2 3 4 | C(i, k) 1 2 | tc(k) | ci(k) | |
|---|---|---|---|---|---|---|---|---|
| 1 | 1 | 0 | x | x x x x | x x | 0 | 0 | |
| 2 | 0 | 0 | x | 1 0 0 0 | 0 0 | 0 | 0 | |
| 3 | 0 | 0 | x | 0 1 0 0 | 0 0 | 0 | 0 | |
| 4 | 0 | 0 | x | 0 0 1 0 | 0 0 | 0 | 0 | |
| 5 | 0 | 0 | x | 0 0 0 1 | 0 0 | 0 | 0 | |
| 6 | 0 | 0 | 1 | 0 0 0 0 | 0 0 | 0 | 0 | ;counter enabled |
| 7 | 0 | 0 | 1 | 0 0 0 0 | 0 1 | 0 | 0 | |
| 8 | 1 | 1 | 1 | 0 0 0 0 | 1 0 | 0 | 0 | ;correction indicated |
| 9 | x | x | 0 | 1 0 0 0 | 1 1 | 1 | 1 | ;correction at |

TABLE 1-continued

| | | | | | | | | |
|---|---|---|---|---|---|---|---|---|
| 10 | x | x | 0 | 0 1 0 0 | 0 0 | 0 | 0 | ;terminal count |
| 11 | x | x | 0 | 0 0 1 0 | 0 0 | 0 | 0 | |

EXAMPLE 4: correction via counter terminal count

| k | c (k) | cor (k) | ce (k) | Register 33 SR2 (i, k) 1 2 3 4 | C (i, k) 1 2 | tc (k) | ci (k) | |
|---|---|---|---|---|---|---|---|---|
| 1 | 1 | 0 | x | x x x x | x x | 0 | 0 | |
| 2 | 0 | 0 | x | 1 0 0 0 | 0 0 | 0 | 0 | |
| 3 | 0 | 0 | x | 0 1 0 0 | 0 0 | 0 | 0 | |
| 4 | 0 | 0 | x | 0 0 1 0 | 0 0 | 0 | 0 | |
| 5 | 0 | 0 | x | 0 0 0 1 | 0 0 | 0 | 0 | |
| 6 | 1 | 1 | 0 | 0 0 0 0 | 0 0 | 0 | 0 | ;counter enabled and |
| 7 | 0 | 0 | 0 | 1 0 0 0 | 0 1 | 0 | 0 | ;correction indicated |
| 8 | 0 | 0 | 0 | 0 1 0 0 | 1 0 | 0 | 0 | |
| 9 | 0 | 0 | 0 | 0 0 1 0 | 1 1 | 1 | 1 | ;correction at |
| 10 | 0 | 0 | 0 | 0 0 0 1 | 0 0 | 0 | 0 | ;terminal count |
| 11 | 0 | 0 | 0 | 0 0 0 0 | 0 0 | 0 | 0 | |

EXAMPLE 5: correction at last register of SR2

| k | c (k) | cor (k) | ce (k) | Register 33 SR2 (i, k) 1 2 3 4 | C (i, k) 1 2 | tc (k) | ci (k) | |
|---|---|---|---|---|---|---|---|---|
| 1 | 1 | 0 | x | x x x x | x x | 0 | 0 | |
| 2 | 0 | 0 | x | 1 0 0 0 | 0 0 | 0 | 0 | |
| 3 | 0 | 0 | x | 0 1 0 0 | 0 0 | 0 | 0 | |
| 4 | 0 | 0 | x | 0 0 1 0 | 0 0 | 0 | 0 | |
| 5 | 1 | 1 | x | 0 0 0 1 | 0 0 | 0 | 0 | ;correction at end |
| 6 | 0 | 0 | 0 | 1 0 0 0 | 0 0 | 0 | 0 | ;of SR |
| 7 | 0 | 0 | 0 | 0 1 0 0 | 0 0 | 0 | 0 | |
| 8 | 0 | 0 | 0 | 0 0 1 0 | 0 0 | 0 | 0 | |
| 9 | 0 | 0 | 0 | 0 0 0 1 | 0 0 | 0 | 0 | |
| 10 | 0 | 0 | 0 | 0 0 0 0 | 0 0 | 0 | 0 | |
| 11 | 0 | 0 | 0 | 0 0 0 0 | 0 1 | 0 | 0 | |

EXAMPLE 6: correction at terminal count

| k | c (k) | cor (k) | ce (k) | Register 33 SR2 (i, k) 1 2 3 4 | C (i, k) 1 2 | tc (k) | ci (k) | |
|---|---|---|---|---|---|---|---|---|
| 1 | 1 | 0 | x | x x x x | x x | 0 | 0 | |
| 2 | 0 | 0 | x | 1 0 0 0 | 0 0 | 0 | 0 | |
| 3 | 0 | 0 | x | 0 1 0 0 | 0 0 | 0 | 0 | |
| 4 | 0 | 0 | x | 0 0 1 0 | 0 0 | 0 | 0 | |
| 5 | 0 | 0 | x | 0 0 0 1 | 0 0 | 0 | 0 | |
| 6 | 0 | 0 | 1 | 0 0 0 0 | 0 0 | 0 | 0 | ;counter enabled |
| 7 | 0 | 0 | 1 | 0 0 0 0 | 0 1 | 0 | 0 | |
| 8 | 0 | 0 | 1 | 0 0 0 0 | 1 0 | 0 | 0 | ;counter cleared, |
| 9 | 1 | 1 | 1 | 1 0 0 0 | 1 1 | 0 | 0 | ;no correction |
| 10 | 0 | 0 | 0 | 0 1 0 0 | 0 0 | 0 | 0 | |
| 11 | 0 | 0 | 0 | 0 0 1 0 | 0 0 | 0 | 0 | |

In addition to the potential for higher rates, the number of gates required to implement the embodiment of the output shift register shown in FIGS. 9A-9B is reduced compared with the more straightforward implementation shown in FIGS. 8A-8B. The number of gates saved increases in proportion to N for large N.

Concerning the compare/save loop, the Viterbi decoder described in the prior art submission of Wood and Petersen requires an n-bit adder and decision logic embedded in an add/compare/update loop. There are three inputs to the adder/decision logic block: the current signal sample from the A/D, a prior saved signal sample and direction indicator. There are therefore $2n+1$ bits of input to the decision logic. The execution speed of the loop will generally be the limiting factor determining the processing speed of the decoder.

There is also a compare/save loop in the system of the present invention. The inputs are the current modified detection margin m'(k), the prior saved margin M(k) and the threshold decoded data sa(k). Assuming MAX=1 there are therefore $2(n-2)+1=2n-3$ bits of input to the cell 25, an improvement of four bits being obtained as a result of preprocessing of the loop variables. This translates into higher execution speeds and less hardware.

Figure 10A:
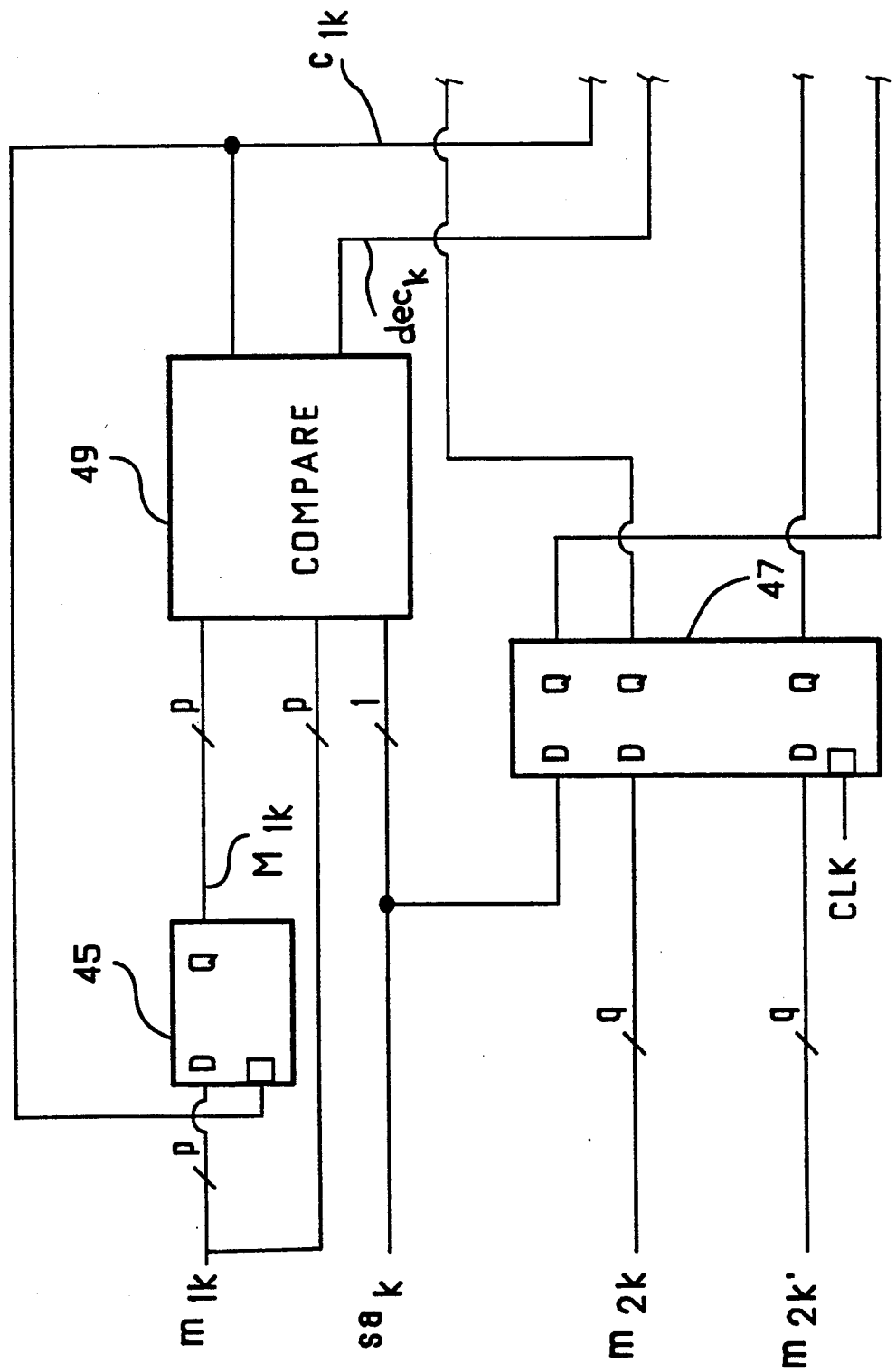
FIGS. 10A-10B are a block schematic diagram of a pipelined compare/save cell in accordance with an alternative embodiment of the second stage decoder shown in FIG. 7.
Figure 10B:
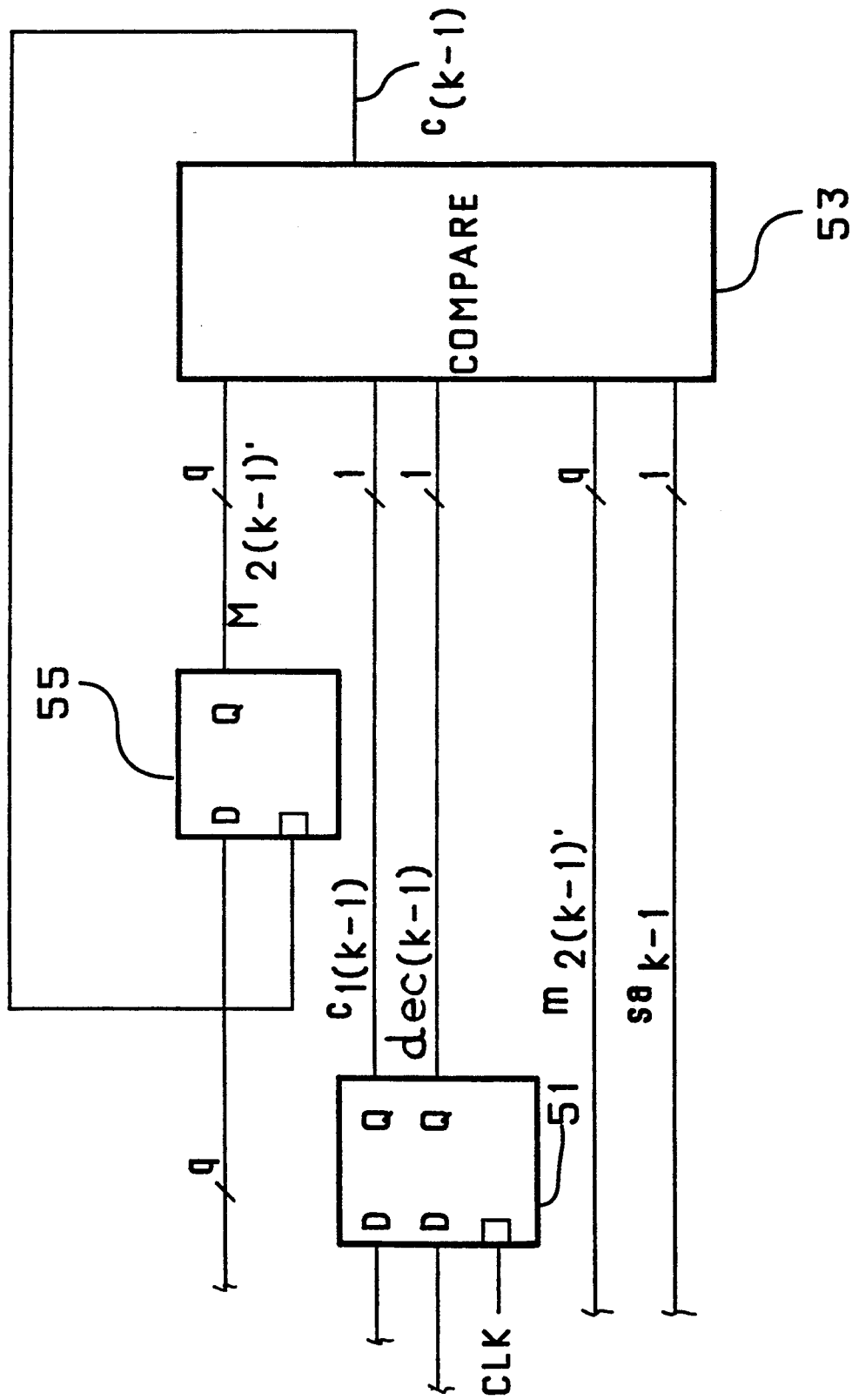

As an alternative to the compare/save cell 25 of the preferred embodiment, a pipelined version may be implemented as shown in FIGS. 10A-10B for higher execution speeds.

The pipelined compare/save cell comprises a first p bit register 45 for receiving the upper p bits of m(k); designated as m(1k); a multiple bit register 47 for receiving the estimated signal sa(k), as well as the lower q bits of m(k), designated as m(2k). A first compare circuit 49 receives the p output M(1k) comprising the upper p bits of the prior margin signal as well as the upper p bits of m(k) designated as m(1k), the estimated signal bit sa(k) and the indicator flag v(k). If v(k)=−1, a first output of compare circuit 49 generates a compare output signal c(1k)=1 EXOR sa(k) when m(1k)<M(1k) and c(1k)=−1 EXOR sa(k) when m(1k)>M(1k). If v(k)=1, said first output generates an output c(1k)=1. The c(1k) signal is connected to a clock input of register 45 as well as the data input of register 51, the second input of register 51 being connected to a further output compare signal 49 which generates a signal dec(k)=−1 when m(1k)=M(1k) and v(k)=−1, and dec(k)=1 when m(1k)≠M(1k) or v(k)=1.

The data clock signal CL is applied to clock inputs of register 47 and 51.

In addition, one output of register 47 and the two outputs of register 51 are connected to a further compare circuit 53, and a second set of q outputs of register 47 is connected to a data input of a further q-bit register 55. The compare circuit 53 generates an output signal c(k−1) conforming to the following relation.

$$\begin{aligned} c(k-1) &= c(1(k-1)), dec(k-1) = 1 \\ &= 1 \; EXOR \; sa(k-1), m2(k-1) < M2(k-1) \text{ and } dec(k-1) = -1 \\ &= -1 \; EXOR \; sa(k-1), m2(k-1) \leq M2(k-1) \text{ and } dec(k-1) = -1 \end{aligned}$$

where m2(.) and M2(.) indicate the lower 1 bits of m(.) and M(.) respectively, In other words, the comparison of the lower q bits of m(k) and M(k) is used to determine the final output c(k) unless the higher order bits have been decisive or the signal v(k) forces a decision that c(k)=1.

The c(k−1) signal is fed back to the clock input of register 55, the output of which generates a second q-bits portion of the prior margin signal M(2(k−1)).

Assuming a compare cell having a maximum input of 2q+3 bits the compare/save block of FIG. 7 can be decomposed into two separate compare/save blocks (49 and 45) and (53 and 55). The first block 49 operates on sa(k), v(k) and the upper p bits of m(k) and M(k), and m(k) is saved or not saved in register 45 depending on the results of these inputs, independent of the lower bits of m(k) and M(k). Two bits from block 49 indicate the results of the first comparison and are fed to the next block 55 which operates on the lower q bits of m(k) and M(k) (2p≦2q+1).

All of the inputs to the second block 55 are registered (e.g. via 47 and 55) and the data flows strictly from left to right. The outputs of the second block do not need to be returned to the first block and as a result the execution speed is increased relative to a single compare/save loop, as shown in FIG. 7. Subsequent blocks equivalent to the second block can be added for increased precision provided the immediately prior block has produced a definite decision c(k)=1 or c(k)=−1.

Thus, in accordance with the present invention, a fast maximum likelihood decoder is provided for (1-D) partial response channels in which violations of known charge constraint conditions are identified in a first stage decoder prior to resolution of a second stage decoder, thereby maximizing the speed and minimizing the complexity of the second stage decoder.

Other embodiments or variations of the invention are possible within the sphere and scope of the claims appended hereto.

We claim:

1. A simplified fast maximum likelihood decoder for (1-D) channels, where D is a unit delay operator, the decoder comprising:
 a) a first stage for receiving an input analog signal including an input data and in response generating a first digital signal representing a threshold detected estimate of the data corresponding to said input data, a second digital signal representing possible charge violations of said threshold detected estimate of the data corresponding to said input data, and a third digital signal representing a detection margin of said threshold detected estimate;
 b) a second stage for receiving said first, second and third digital signals and in response generating a fourth digital signal representing a current estimate of the data corresponding to said input data based on said threshold detected estimate and current and prior values of said detection margin, and a plurality of control signals representing a location of possible errors in said threshold detected estimate of said input signal based on said possible charge violations and said detection margin; and
 c) an output shift register for receiving said fourth digital signal and said control signals and selectively inverting a predetermined one or more bits of said current estimate of said input data responsive to said location of possible errors, thereby generating a corrected decoded output signal.

2. The decoder of claim 1 wherein said first stage further comprises:
 a) an analog-to-digital converter for receiving and converting said input analog signal to a corresponding digital input signal sample at intervals of a clock signals derived from the received input signal,
 b) a threshold detector for receiving said input signal sample and in response generating said first digital signal,
 c) a first register for receiving said first digital signal and a sign bit of said input signal sample and in response generating a direction indicator signal,
 d) a margin calculator for receiving said input signal sample, said first digital signal and said direction indicator signal and in response generating said third digital signal,
 e) a second register for receiving said clock signal and said direction indicator signal and in response generating a delayed version of said direction indicator signal,
 f) a first EXCLUSIVE-OR gate for receiving said direction signal and said delayed version of said direction indicator signal and in response generating said second digital signal,
 g) a first invertor for receiving said second digital signal and in response generating an inverted version of said second digital signal, and
 h) a plurality of OR gates for receiving said third digital signal and said inverted version of said second digital signal and in response generating a modified margin signal.

3. The decoder of claim 2 wherein said second stage further comprises:
 i) a comparison/save circuit for receiving said third digital signal, said modified margin signal and said first digital signal and in response generating a compare output control signal, a possible error flag signal and a clear control signal,
 j) a first AND gate for receiving said compare output control signal and said first digital signal and in response generating said fourth digital signal, and
 k) a second AND gate for receiving said first digital signal, said second digital signal and said compare output control signal and in response generating a correct control signal.

4. The decoder of claim 3 wherein said shift register further comprises:

l) a possible error register for receiving said timing control signal, said possible error flag signal, and said clear control signal and in response generating a plurality of parallel error location control signals, and m) a data register for receiving said fourth digital signal, said correct control signal, and said plurality of parallel error location control signals and in response generating said corrected decoded output signal.

5. The decoder of claim 2 wherein said margin calculator generates said third digital signal in accordance with the relation:

$$m(k) = \min \left\{ \begin{array}{l} \text{MAX} \\ |s(k) - d(k) \cdot sa(k)|, \end{array} \right.$$

wherein m(k) represents said third digital signal, s(k) represents said input signal samples, d(k) represents said direction indicator signal, and sa(k) represents said first digital signal.

6. The decoder of claim 3 wherein said comparison/save circuit further comprises a third register, a comparator, and a second EXCLUSIVE-OR gate, a data input of said third register being provided for receiving said third digital signal, an output of said third register being connected to a first input of said comparator, a second input of said comparator being provided for receiving said modified margin signal, an output of said comparator being connected to a first input of said second EXCLUSIVE-OR gate, a second input of said second EXCLUSIVE-OR gate being provided for receiving said first digital signal, an output of said second EXCLUSIVE-OR gate generating said compare output signal, said possible error flag signal, and said clear control signal, and a further input of said third register being connected to said output of said second EXCLUSIVE-OR gate for receiving said compare output signal.

* * * * *